(12) United States Patent
Wu et al.

(10) Patent No.: US 11,984,374 B2
(45) Date of Patent: May 14, 2024

(54) WARPAGE CONTROL OF PACKAGES USING EMBEDDED CORE FRAME

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW); Chung-Shi Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 2 days.

(21) Appl. No.: 17/650,932

(22) Filed: Feb. 14, 2022

(65) Prior Publication Data

US 2022/0173003 A1 Jun. 2, 2022

Related U.S. Application Data

(62) Division of application No. 16/527,322, filed on Jul. 31, 2019, now Pat. No. 11,251,099.

(51) Int. Cl.
*H01L 23/31* (2006.01)
*H01L 21/56* (2006.01)

(52) U.S. Cl.
CPC ........ *H01L 23/3114* (2013.01); *H01L 21/568* (2013.01)

(58) Field of Classification Search
CPC ............................ H01L 23/3114; H01L 21/568
See application file for complete search history.

(56) References Cited

U.S. PATENT DOCUMENTS

| | | | |
|---|---|---|---|
| 10,134,683 B2 * | 11/2018 | Chen | ................. H01L 25/105 |
| 10,153,239 B2 | 12/2018 | Wang et al. | |
| 10,163,807 B2 | 12/2018 | Chen et al. | |
| 10,515,936 B1 | 12/2019 | Chien et al. | |
| 10,522,436 B2 | 12/2019 | Yu et al. | |
| 10,916,450 B2 | 2/2021 | Tsou et al. | |
| 11,127,644 B2 | 9/2021 | Yu et al. | |
| 11,189,603 B2 | 11/2021 | Yu et al. | |
| 2015/0348955 A1 | 12/2015 | Wu | |
| 2016/0336249 A1 | 11/2016 | Kang et al. | |
| 2017/0162542 A1 | 6/2017 | Chen et al. | |
| 2017/0330814 A1 | 11/2017 | Kang et al. | |
| 2018/0096940 A1 * | 4/2018 | Kim | ................. H01L 23/16 |
| 2018/0294202 A1 | 10/2018 | Cheng et al. | |

(Continued)

FOREIGN PATENT DOCUMENTS

| CN | 108695265 A | 10/2018 |
|---|---|---|
| CN | 109786268 A | 5/2019 |

(Continued)

*Primary Examiner* — Lex H Malsawma
(74) *Attorney, Agent, or Firm* — Slater Matsil, LLP

(57) ABSTRACT

A method includes placing a package component over a carrier. The package component includes a device die. A core frame is placed over the carrier. The core frame forms a ring encircling the package component. The method further includes encapsulating the core frame and the package component in an encapsulant, forming redistribution lines over the core frame and the package component, and forming electrical connectors over and electrically coupling to the package component through the redistribution lines.

20 Claims, 18 Drawing Sheets

(56) References Cited

U.S. PATENT DOCUMENTS

| | | | |
|---|---|---|---|
| 2018/0301418 A1* | 10/2018 | Chang Chien | H01L 21/6835 |
| 2019/0164863 A1* | 5/2019 | Cho | H01L 24/32 |
| 2019/0378803 A1* | 12/2019 | Chang Chien | H01L 21/56 |
| 2019/0393200 A1 | 12/2019 | Chien et al. | |
| 2020/0027851 A1 | 1/2020 | Ting et al. | |

FOREIGN PATENT DOCUMENTS

| | | | |
|---|---|---|---|
| KR | 20160134435 A | 11/2016 | |
| KR | 20180002913 A | 1/2018 | |
| KR | 20180105560 A | 9/2018 | |
| KR | 20190003294 A | 1/2019 | |
| KR | 20190055692 A | 5/2019 | |
| TW | 201724440 A | 7/2017 | |
| TW | 201830531 A | 8/2018 | |
| TW | 201923911 A | 6/2019 | |
| TW | 201926602 A | 7/2019 | |
| WO | 2012029549 A1 | 3/2012 | |

\* cited by examiner

WARPAGE CONTROL OF PACKAGES USING EMBEDDED CORE FRAME

PRIORITY CLAIM AND CROSS-REFERENCE

This application is a divisional of U.S. patent application Ser. No. 16/527,322, entitled "Warpage Control of Packages Using Embedded Core Frame," filed on Jul. 31, 2019, which application is incorporated herein by reference.

BACKGROUND

High-Performance Computing (HPC) packages are increasingly being used for performance-demanding applications such as Artificial Intelligence (AI) applications. The sizes of the HPC packages become increasingly larger also. The larger sizes cause the packages to have significant warpage.

An HPC package may include a package bonded to a package substrate. To control the warpage, the thicknesses of the package substrates were increased to improve the warpage-resistance. This solution, however, results in the electrical paths in the HPC package to be longer, and causes the increase in the IR drop, which may seriously degrade the performance of the HPC packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
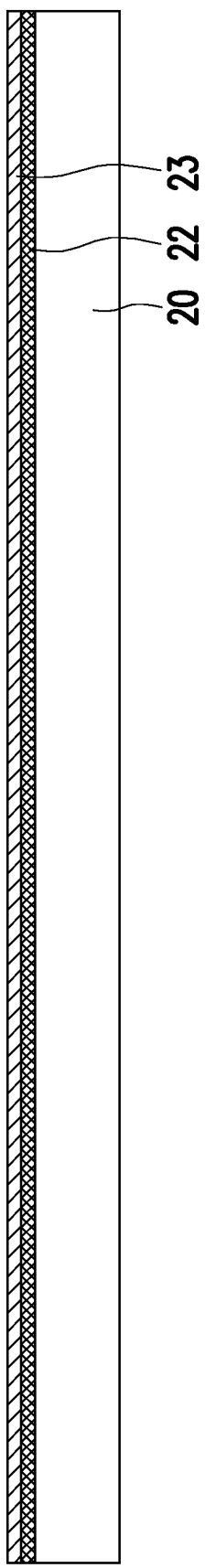
FIGS. 1, 2A, 2B, 3A, 3B, and 4-10 illustrate the cross-sectional views and perspective views of intermediate stages in the formation of a package in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided in accordance with some embodiments. The intermediate stages in the formation of the package are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, a package component is disposed in an opening encircled by a core frame. The core frame and the package component are encapsulated in an encapsulant such as molding compound. Redistribution lines (RDLs) are formed starting from the encapsulant to electrically connect to the package component. The core frame provides the mechanical support and reduces the warpage, while it does not include Plating Through-Holes (PTHs, which are conductive pipes) penetrating through the core frame for electrical routing function. Accordingly, while providing mechanical support, the thickness of the core frame does not cause the increase in the IR drop of the electrical signals and power in the resulting package.

Figure 16:
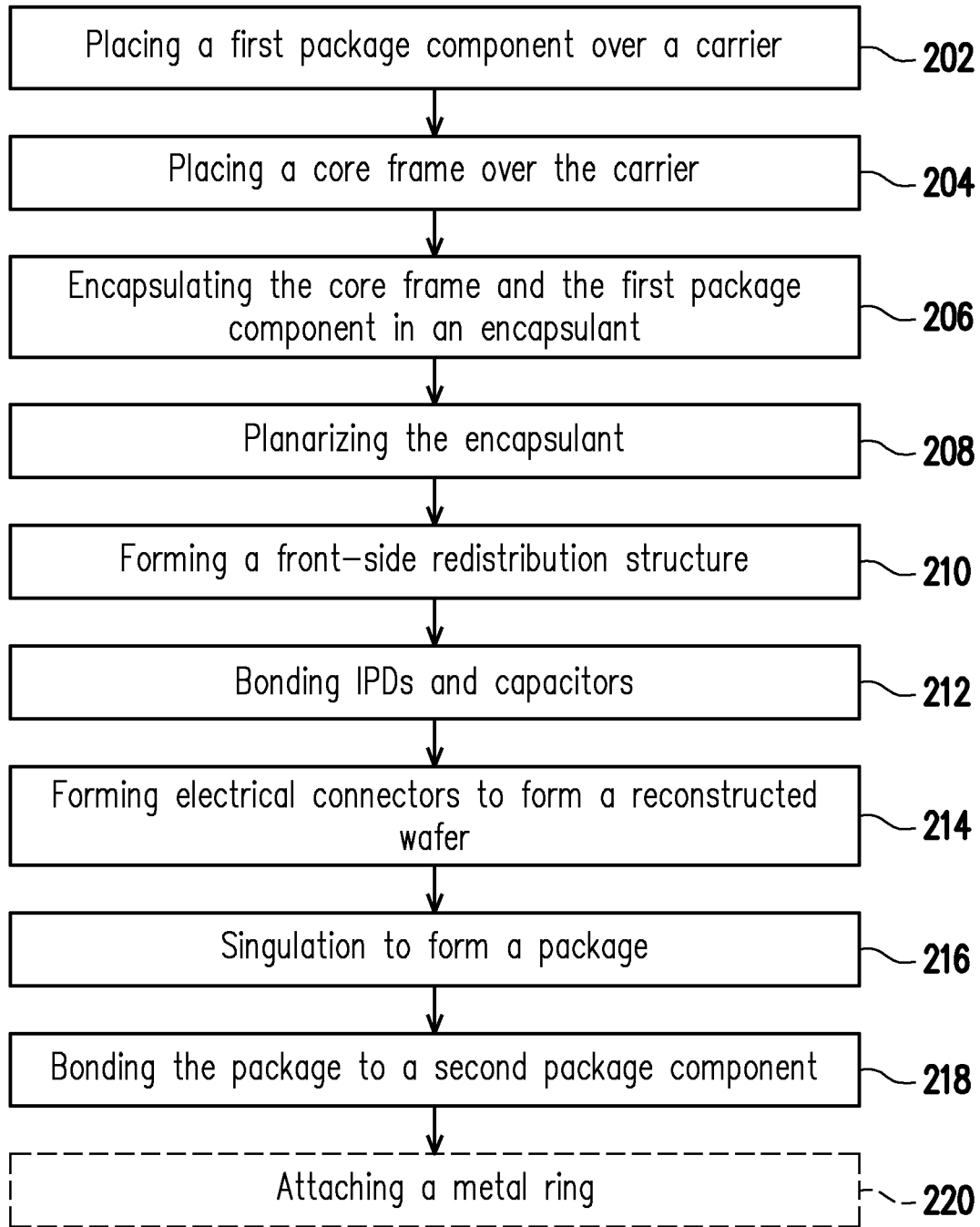
FIG. 16 illustrates a process flow for forming a package in accordance with some embodiments.

FIGS. 1, 2A, 2B, 3A, 3B, and 4 through 10 illustrate the cross-sectional views of intermediate stages in the formation of a package in accordance with some embodiments of the present disclosure. The corresponding processes are also reflected schematically in the process flow 200 shown in FIG. 16.

Figure 11A:
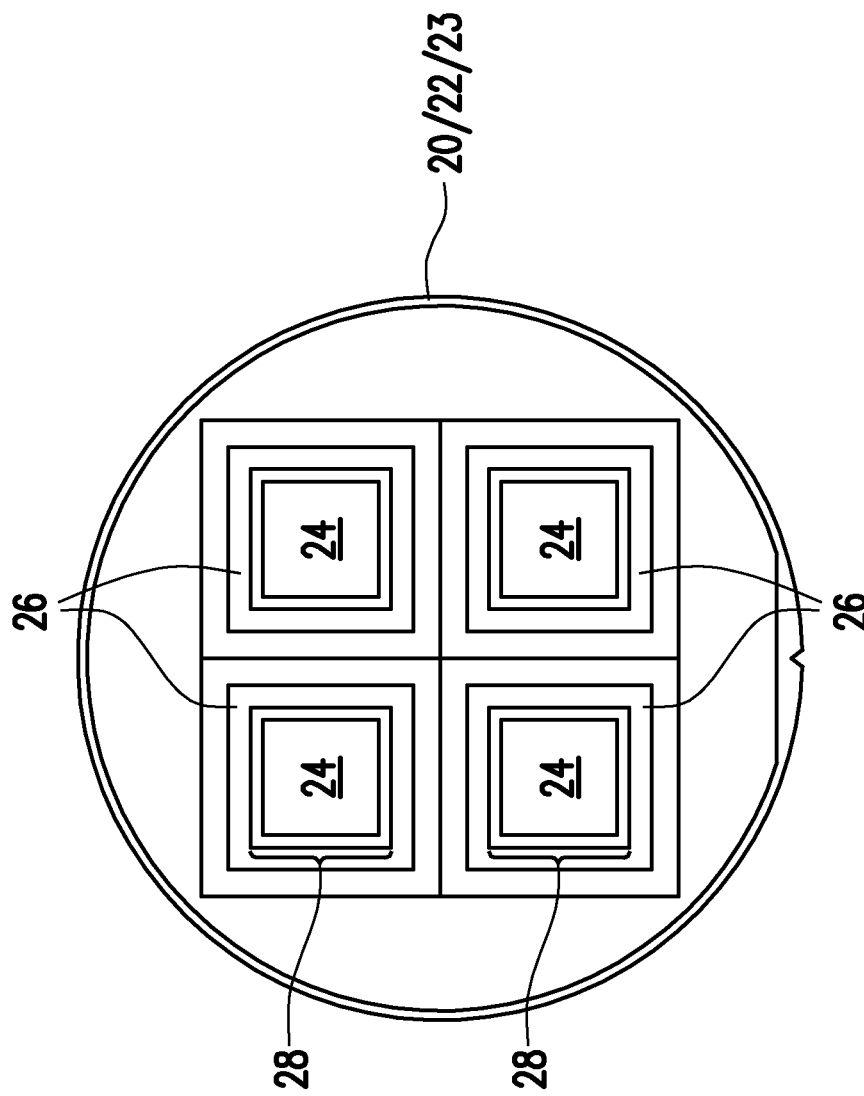
FIGS. 11A and 11B illustrates the top views of packages and core frames placed on a round carrier and a rectangular carrier, respectively, in accordance with some embodiments.
Figure 11B:
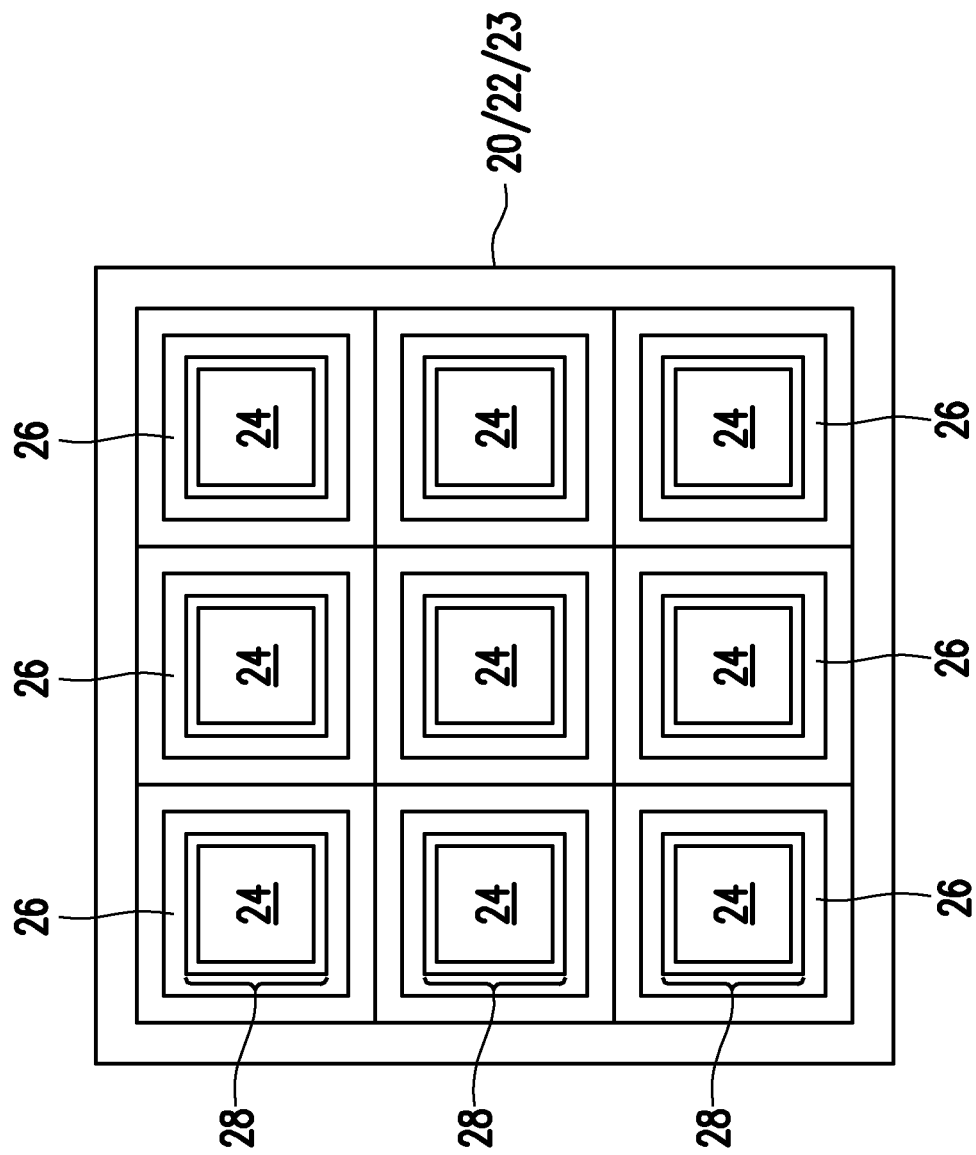

FIG. 1 illustrates carrier 20 and release film 22 formed over carrier 20. Carrier 20 may be a glass carrier, a ceramic carrier, or the like. In accordance with some embodiments of the present disclosure, carrier 20 has a round top-view shape, as shown in FIG. 11A. Carrier 20 may have a size of a typical silicon wafer, which may have an 8-inch diameter, a 12-inch diameter, or larger. In accordance with alternative embodiments of the present disclosure, carrier 20 has a rectangular top-view shape, as shown in FIG. 11B.

Referring back to FIG. 1, release film 22 is formed on carrier 20. Release film 22 may be formed of a polymer-based material (such as a Light-To-Heat-Conversion (LTHC) material), which may be removed along with carrier 20 from the overlying structures that will be formed in subsequent processes. In accordance with some embodiments of the present disclosure, release film 22 is formed of an epoxy-based thermal-release material. In accordance with some embodiments of the present disclosure, Die-Attach Film (DAF) 23 is formed over release film 22. DAF 23 is an adhesive film, and may be coated or laminated. In accordance with alternative embodiments, instead of forming a wafer-size DAF, individual DAFs are formed under the components that are to be attached over release film 22.

Figure 2A:
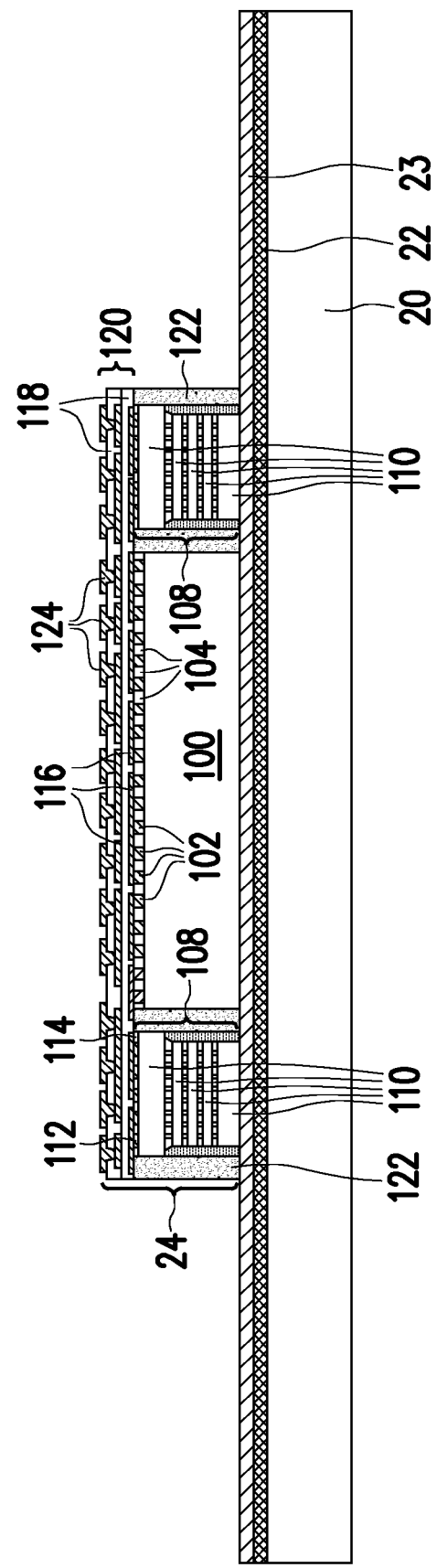
Figure 2B:
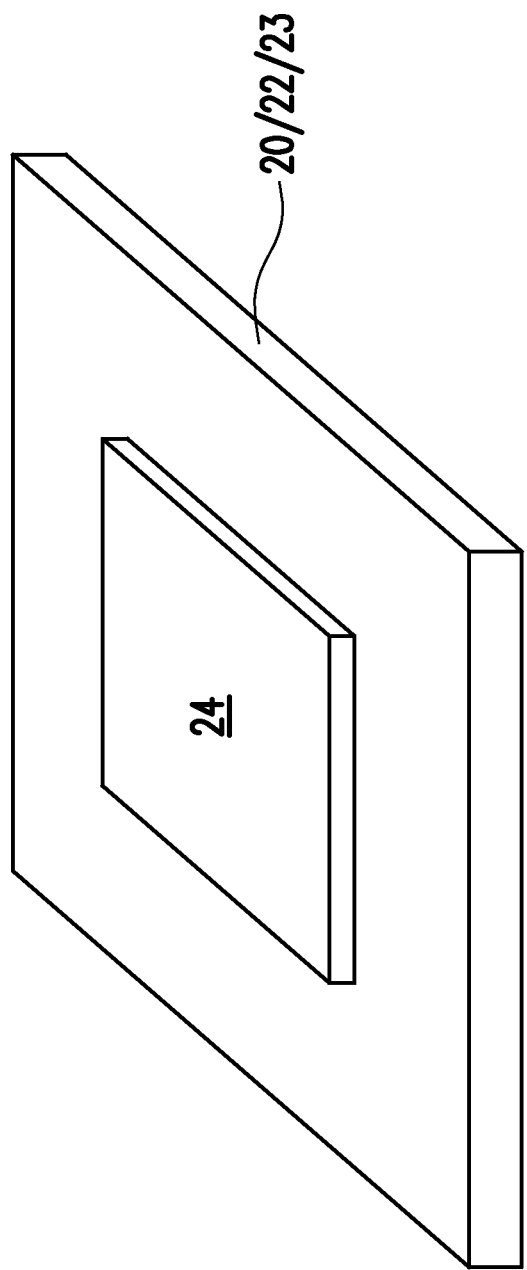

FIGS. 2A and 2B illustrate the placement of a package component 24 over release film 22, for example, through DAF 23. The respective process is illustrated as process 202 in the process flow 200 shown in FIG. 16. Package component 24 may be a package that is formed through a packaging process, which may include logic dies (such as computing dies), memory dies (such as Dynamic Random Access Memory (DRAM) dies or Static Random Access Memory (SRAM) dies), photonic dies, packages (including device dies that have already been packaged), Input-output (IO) dies, digital dies, analog dies, surface-mount passive devices, or the like. The die(s) in package component 24 may be encapsulated in one or more encapsulant such as molding compound, underfill, or the like. Package component 24 may also be a device die. In accordance with some embodiments of the present disclosure, package component 24 is a High-Performance Computing (HPC) package, which may be used in performance-demanding applications such as Artificial Intelligence (AI) applications. FIG. 2A illustrates an example of package component 24, and package component 24 may have other structures.

In accordance with some embodiments of the present disclosure, package component 24 includes System-on-Chip (SoC) die 100, which is a package including device dies bonded together to form a system. The device dies in SoC die 100 is not shown in detail. SoC die 100 may include metal bumps 102 at surface, and metal bumps 102 may be embedded in surface dielectric layer 104. In accordance with some embodiments of the present disclosure, surface dielectric layer 104 is formed of a polymer such as polybenzoxazole (PBO), polyimide, benzocyclobutene (BCB), or the like. Metal bumps 102 may be formed of copper, nickel, palladium, gold, composite layers thereof, and/or alloys thereof.

Package component 24 may also include High-Bandwidth Memory (HBM) stacks 108, with each of HBM stacks 108 including a plurality of memory dies 110 stacked together to form the memory stack. Memory dies 110 may be DRAM dies, SRAM dies, or other types of memory dies. The device dies in SoC die 100 is not shown in detail. HBM stack 108 may include metal bumps 112 at surface, and metal bumps 112 may be embedded in the surface dielectric layer 114 of HBM stack 108 or encapsulant 122. In accordance with some embodiments of the present disclosure, surface dielectric layer 114 is formed of a polymer such as PBO, polyimide, BCB, or the like. Metal bumps 112 may also be formed of copper, nickel, palladium, gold, composite layers thereof, and/or alloys thereof.

In accordance with some embodiments of the present disclosure, the formation of package component 24 includes placing a plurality of SoC dies 100 and a plurality of HBM stacks 108 onto another carrier (not shown), encapsulating the plurality of SoC dies 100 and the plurality of HBM stacks 108 in encapsulant 122, and performing a planarization process such as a Chemical Mechanical Polish (CMP) process or a mechanical grinding process, until metal bumps 102 and 112 are exposed. Interconnect structure 120 is then formed over SoC dies 100, HBM stacks 108, and encapsulant 122. Interconnect structure 120 includes dielectric layers 118, and RDLs 116 in dielectric layers 118. Surface conductive features (such as metal pads, metal pillars, or the like) 124 are formed at the top surface of package component 24. Accordingly, a reconstructed wafer is formed, which includes the plurality of SoC dies 100 and the plurality of HBM stacks 108. A singulation process may then be performed to saw-through the reconstructed wafer into a plurality of package components 24.

In accordance with alternative embodiments, interconnect structure 120, instead of being formed layer-by-layer after the encapsulation of the plurality of SoC dies 100 and the plurality of HBM stacks 108, may be pre-formed as a package substrate strip (cored or coreless), an interposer wafer (with through-vias penetrating through the corresponding substrate), or the like. When interconnect structure 120 is an interposer, it may include a semiconductor substrate (such as a silicon substrate), and through-vias penetrating through the semiconductor substrate to interconnect the conductive features on opposite sides of the semiconductor substrate. The formation of the corresponding package component 24 may include bonding a plurality of SoC dies 100 and a plurality of HBM stacks 108 onto the interposer wafer or the package substrate strip, which includes a plurality of interposers and a plurality of package substrates, respectively, therein. The SoC dies 100 and HBM stacks 108 are then encapsulated in encapsulant 122. A singulation process is then performed to form a plurality of package components 24.

FIG. 2B illustrates a schematic perspective view of the structure shown in FIG. 2A, with package component 24, carrier 20, release film 22, and DAF 23 being illustrated.

Figure 3A:
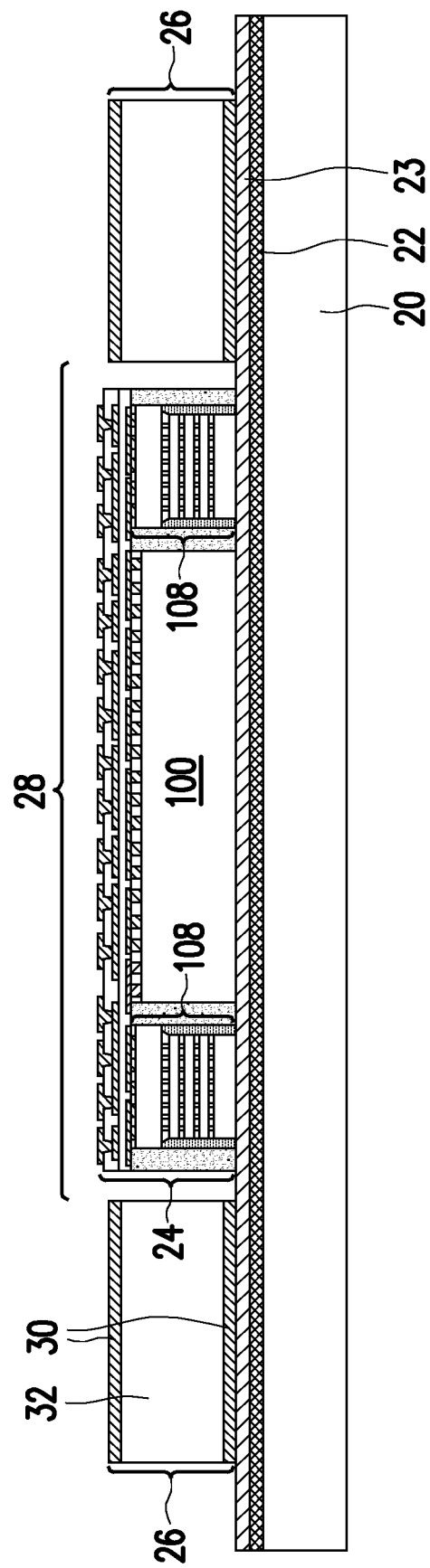
Figure 3B:
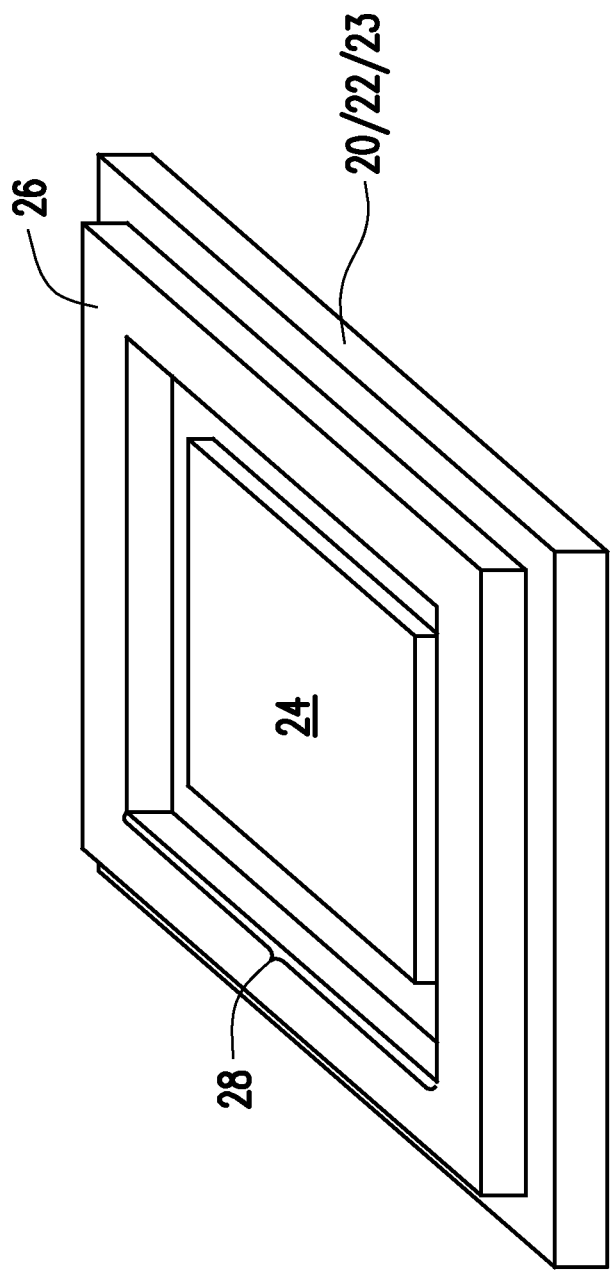

FIGS. 3A and 3B illustrate the placement of core frame 26 over carrier 20. The respective process is illustrated as process 204 in the process flow 200 shown in FIG. 16. Core frame 26 may also be attached to carrier 20 through DAF 23. In accordance with alternative embodiments, instead of forming a wafer-level DAF, onto which all of SoC dies 100 and HBM stacks 108 are attached, each of package components 24 and HBM stacks 108 may have an individual DAF underneath it, and the individual DAFs may have same shapes and same sizes as the corresponding overlying package components 24 and HBM stacks 108. Similarly, a DAF may also be attached to the bottom of core frame 26 for the adhesion when no wafer-level DAF is used. As shown in FIG. 3B, core frame 26 may form a rectangular ring, with through-opening 28 therein, and with package component 24 being in opening 28. In accordance with some embodiments of the present disclosure, core frame 26 has the similar structure, and may be formed of the same material as the core frame in a cored package substrate. Core frame 26, however, differs from the conventional cored package substrate in that core frame 26 is free from Plating Through-Holes (PTHs) in the cored package substrate. The PTHs are conductive (such as metal, which may include copper, for example) pipes penetrating through the core dielectric, and are used for conducting electrical signals and power on the opposite sides of the core dielectric. In addition, core frame 26 may include metal plates 30 on the opposite sides of core dielectric 32, with metal plates 30 being blanket metal plates free from holes and breaks therein, which differ from the patterned RDLs in conventional cored package substrates. Metal plates 30 have the function of providing structural support so that the resistance of core frame 26 to warpage is improved.

In accordance with some embodiments of the present disclosure, core dielectric 32 comprises fiber glass. Core dielectric 32 may also include epoxy, resin, prepreg (which comprises epoxy, resin, and/or fiber glass), resin coated Copper (RCC), glass, molding compound, plastic (such as PolyVinylChloride (PVC), Acrylonitril, Butadiene & Styrene (ABS), Polypropylene (PP), Polyethylene (PE), Polystyrene (PS), Polymethyl Methacrylate (PMMA), Polyethylene Terephthalate (PET), Polycarbonates (PC), Polyphenylene sulfide (PPS), flex (polyimide), combinations thereof, and multi-layers thereof. Metal plates 30 may be formed of copper, nickel, tungsten, or the like, or the alloys thereof. In accordance with some embodiments, no conductive feature is formed between metal plates 30.

FIGS. 11A and 11B illustrate the top views of the placed package components 24 and core frames 26 in accordance with some embodiments. Referring to FIG. 11A, carrier 20 is a carrier wafer having a round top-view shape. Release film 22 and DAF 23 may also have the round top-view shapes. A plurality of core frames 26 are placed as an array including a plurality of rows and a plurality of columns. Core frames 26 are spaced apart from each other. A package component 24 is placed in the opening 28 of each of core frames 26.

Referring to FIG. 11B, carrier 20 has a rectangular top-view shape. Release film 22 and DAF 23 may also have the rectangular top-view shapes. A plurality of core frames 26 are placed as an array including a plurality of rows and a plurality of columns. Core frames 26 are also spaced apart from each other. A package component 24 is placed in the opening 28 of each of core frames 26. Throughout the description, both of carriers 20 shown in FIG. 11A and are referred to as being in wafer-form, over which a plurality of dies/packages may be placed.

In accordance with alternative embodiments of the present disclosure, instead of placing core frame 26, a rigid ring is placed over carrier 20. The rigid ring may be formed of a rigid material, which may be formed of a metal (such as copper, stainless steel, or the like) or a metal alloy. The rigid ring may be formed of ceramic in accordance with some embodiments. The rigid ring may have the same size and the same top-view shape as core frame 26.

Figure 4:
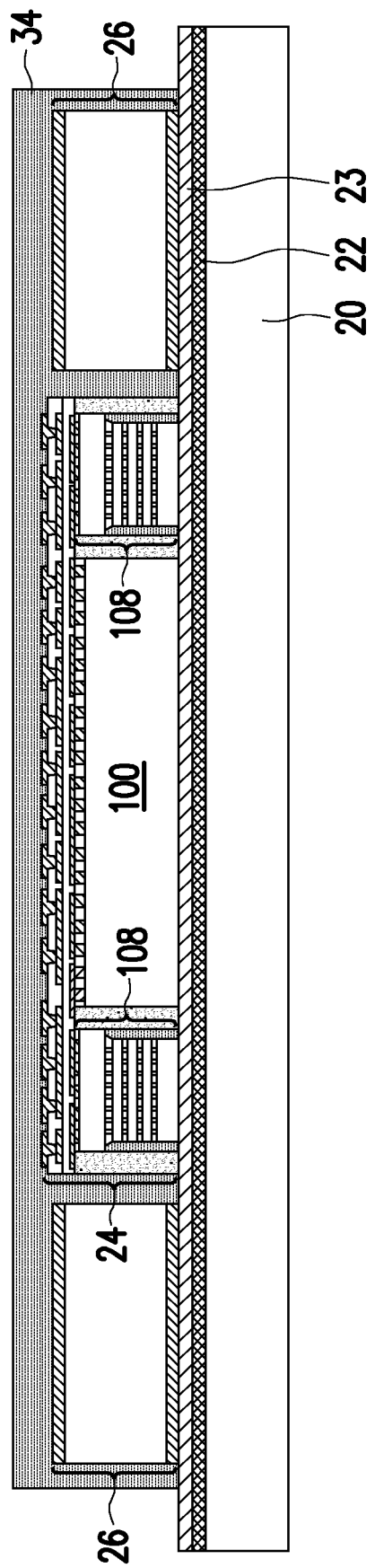

Next, package component 24 and core frame 26 are encapsulated in encapsulant 34, as shown in FIG. 4. The respective process is illustrated as process 206 in the process flow 200 shown in FIG. 16. Encapsulant 34 fills the gaps between neighboring core frames 26 and the remaining portions of openings 28. Encapsulant 34 may include a molding compound, a molding underfill, an epoxy, and/or a resin. The top surface of encapsulant 34 is higher than the top ends of core frames 26 and package components 24. Encapsulant 34 may include a base material, which may be a polymer, a resin, an epoxy, and/or the like, and filler particles in the base material. The filler particles may be dielectric particles of $SiO_2$, $Al_2O_3$, silica, or the like, and may have spherical shapes. Also, the spherical filler particles may have a plurality of different diameters.

Figure 5:
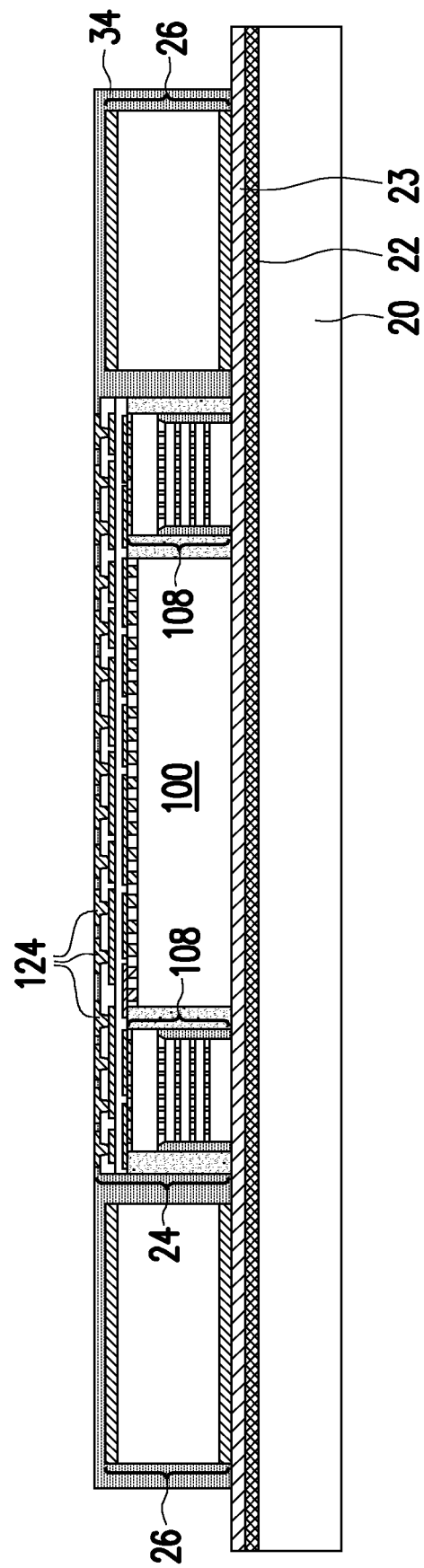

Subsequently, a planarization process such as a CMP process or a mechanical grinding process is performed to thin encapsulant 34, until conductive features 124 are exposed. The respective process is illustrated as process 208 in the process flow 200 shown in FIG. 16. The resulting structure is shown in FIG. 5. Due to the planarization process, the top ends of core frame 26 may be level (coplanar) with or lower than the top surfaces of conductive features 124 and encapsulant 34. In accordance with some embodiments of the present disclosure, encapsulant 34 includes a layer overlapping core frame 26. In accordance with alternative embodiments of the present disclosure, the top surface of core frame 26 is exposed after the planarization process.

Figure 6:
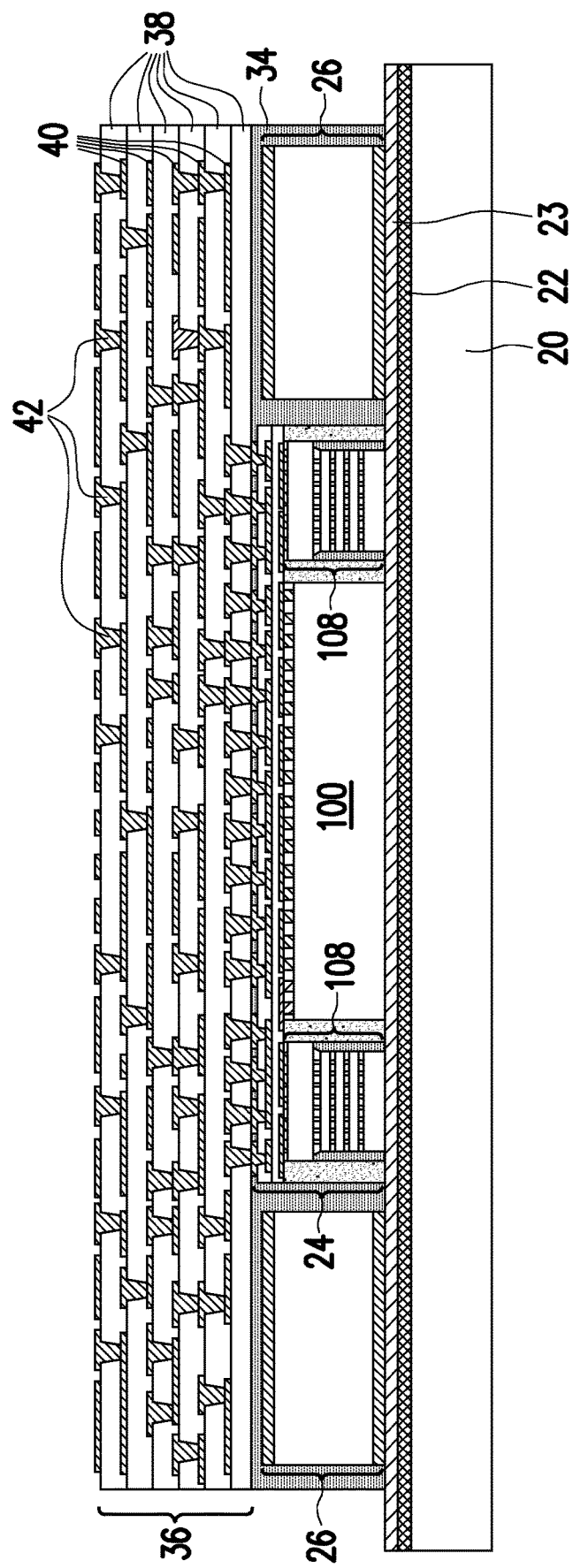

FIG. 6 illustrates the formation of front-side redistribution structure 36, which includes a plurality of dielectric layers 38, RDLs 40, and metal pads 42. Metal pads 42 are the top surface portions of front-side redistribution structure 36, and are exposed. The respective process is illustrated as process 210 in the process flow 200 shown in FIG. 16. In accordance with some embodiments of the present disclosure, dielectric layers 38 are formed of polymers such as PBO, polyimide, or the like. The formation process of a dielectric layer 38 and a corresponding layer of RDLs 40 may include forming a dielectric layer 38, and then patterning dielectric layer 38 to form via openings, through which the underlying conductive features such as conductive features 124 or the underlying RDLs 40 are exposed. In accordance with some embodiments in which dielectric layer 38 is formed of a photo-sensitive material such as PBO or polyimide, the formation of the via openings involves a photo exposure process using a lithography mask (not shown), and a development process. In accordance with alternative embodiments of the present disclosure, dielectric layer 38 is formed of an inorganic dielectric material such as silicon nitride, silicon oxide, or the like, which may be formed through a deposition process such as a Chemical Vapor Deposition (CVD) process, an Atomic Layer Deposition (ALD) process, a Plasma-Enhanced Chemical Vapor Deposition (PECVD) process, or other applicable deposition processes. The deposited dielectric layer 38 is etched to form the via openings. A seed layer is then deposited as a blanket layer. The seed layer may include a titanium sub-layer and a copper sub-layer over the titanium sub-layer, which may be formed through Physical Vapor Deposition (PVD), for example. A plating mask (not shown), which may be formed of photo resist, is then formed and patterned to reveal the underlying metal seed layer. A plating process is performed to plate a metallic material. The plating mask is then removed, followed by an etching process to remove the portions of the metal seed layer not covered by the plated material. The plated material and the underlying remaining portions of the seed layer form the RDLs 40.

Front-side redistribution structure 36 may include five to nine or more RDL layers 40. In accordance with some embodiments of the present disclosure, the line width of the RDLs may be smaller than about 3 μm, or close to about 2 μm. Accordingly, the number of RDL layers 40 may be reduced to meet the routing requirement.

As shown in FIG. 6, core frame 26, being a part of the resulting package, has the function of providing mechanical support to the resulting package. Since core frame 26 may have the thickness as great as the thickness of package component 24 and memory stack 108, which have the thicknesses of multiple stacked dies, core frame 26 may provide significant mechanical support for reducing warpage, without causing adverse increase in the electrical paths since it is not in the middle of the electrical paths. The effect is similar to moving the core of the cored package substrate out of the routing path to the same level of package component 24, so that its function of providing mechanical support remains without causing the increase in the lengths of electrical paths.

Figure 7:
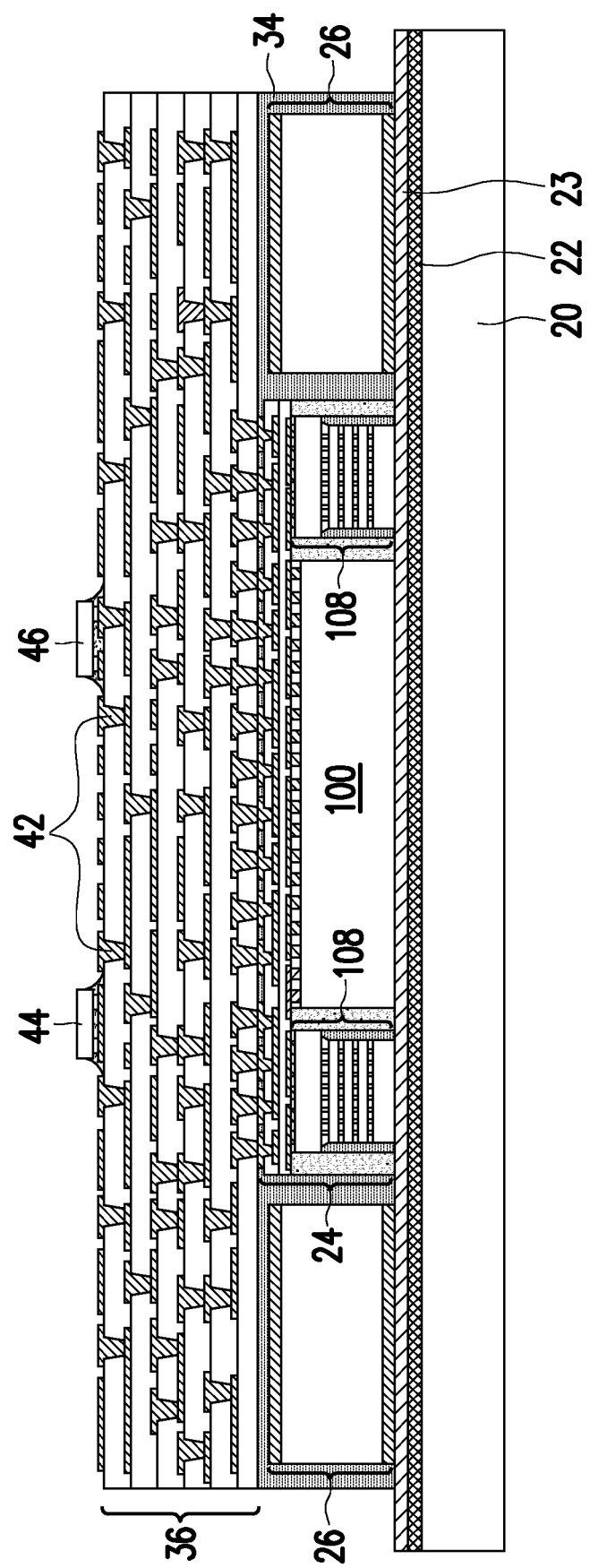

FIG. 7 illustrates the bonding of Independent Passive Device (IPD) 44 and capacitor 46 onto metal pads 42. The respective process is illustrated as process 212 in the process flow 200 shown in FIG. 16. IPD 44 may be an inductor, a resistor, a capacitor, or the like. Capacitor 46 may be a Multi-Layer Ceramic Capacitors (MLCC), and may be used as a storage of power. As shown in FIG. 7, the electrical path between capacitor 46 and package component 24, which uses the stored power, is short because there is no core between capacitor 46 and package component 24. In accordance with some embodiments of the present disclosure, package component 24 is an HPC package, which is demanding in performance. With the electrical path between capacitor 46 and package component 24 being short, capacitor 46 may provide power to satisfy the surge requirement of package component 24 without significant IR drop and latency.

Figure 8:
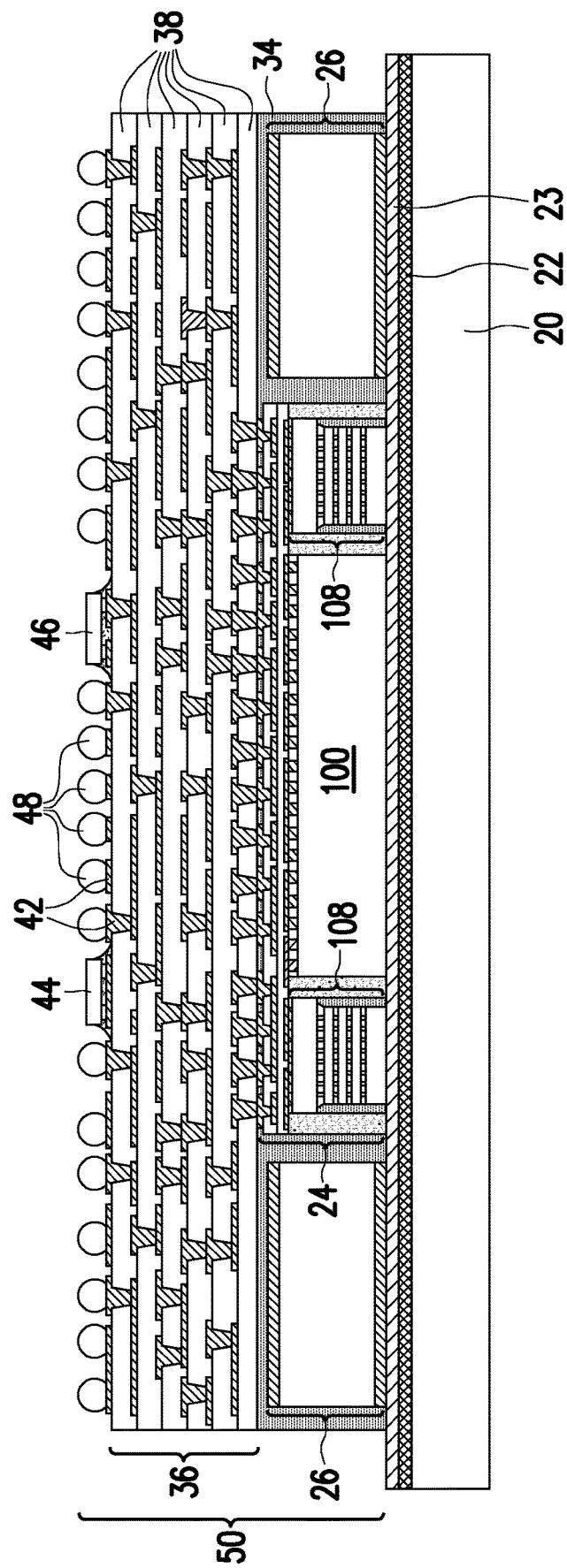

FIG. 8 illustrates the formation of electrical connectors 48. The respective process is illustrated as process 214 in the process flow 200 shown in FIG. 16. The formation of electrical connectors 48 may include placing solder balls on the exposed portions of metal pads 42, and then reflowing the solder balls, and hence electrical connectors 48 are solder regions. In accordance with alternative embodiments of the present disclosure, the formation of electrical connectors 48 includes performing a plating step to form solder layers over metal pads 42, and then reflowing the plated solder layers. Electrical connectors 48 may also include non-solder metal pillars, or metal pillars and solder caps over the non-solder metal pillars, which may also be formed through plating. Throughout the description, the structures and components overlying DAF 23 are in combination referred to as reconstructed wafer 50.

Next, reconstructed wafer 50 is placed on a tape (not shown), which is attached to a dicing frame (not shown). In accordance with some embodiments of the present disclosure, electrical connectors 48 are in contact with the tape. Next, reconstructed wafer 50 is de-bonded from carrier 20. In accordance with some embodiments of the present disclosure, to de-bond reconstructed wafer 50, a light beam is projected on release film 22, and the light penetrates through the transparent carrier 20. In accordance with some embodiments of the present disclosure, the light includes a laser beam, which is scanned through the entire release film 22.

Figure 9:
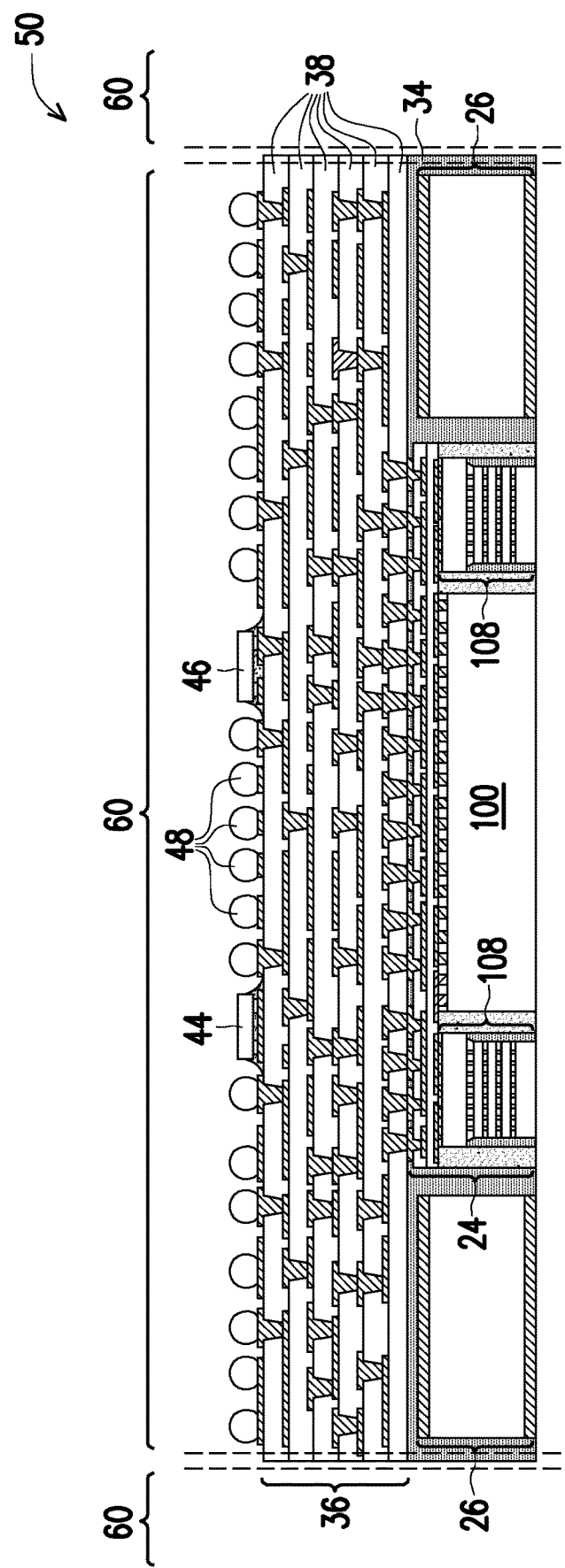

As a result of the light-exposure (such as the laser scanning), carrier 20 may be lifted off from DAF 23, and hence reconstructed wafer 50 is de-bonded (demounted) from carrier 20. During the light exposure, release film 22 is decomposed in response to the heat introduced by the light exposure, allowing carrier 20 to be separated from the overlying structure. The residue of release film 22 is then removed, for example, through a plasma cleaning step. DAF 23 may also be removed. The resulting reconstructed wafer 50 is shown in FIG. 9. If individual DAFs, rather than a blanket DAF, are used, the individual DAFs may be removed through grinding, or may be left un-removed. In which case, core frames 26 and package components 24 overlaps the corresponding DAFs, which have the same sizes and top-view shapes as the overlying core frames 26 and package components 24. The individual DAFs may be in encapsulant 34, and may have bottom surfaces coplanar with the bottom surface of encapsulant 34.

Reconstructed wafer 50 may then be singulated in a singulation process, which may be performed using a die-saw process. The respective process is illustrated as process 216 in the process flow 200 shown in FIG. 16. For example, a blade may be used to saw-through encapsulant 34 and dielectric layers 38 to separate the reconstructed wafer 50 into a plurality of identical packages 60, each having the structure as illustrated in accordance with some examples. In the resulting package 60, core frame 26 may be spaced apart from the nearest edges of the package 60 by some encapsulant 34.

Figure 10:
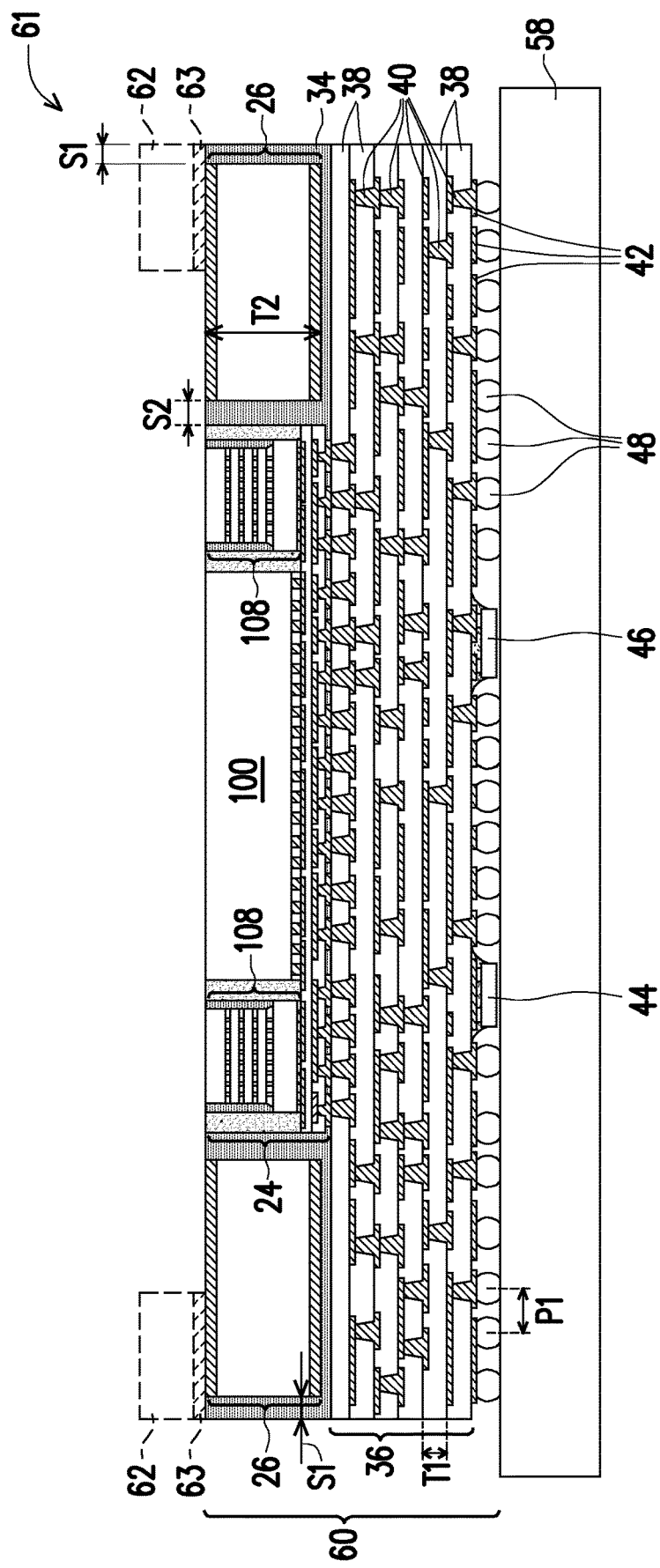

FIG. 10 illustrates an example package 60. In accordance with some embodiments of the present disclosure, thicknesses T1 of the dielectric layers 38 may be in the range between about 5 μm and about 100 μm. Thickness T2 of core frame 26 may be in the range between about 20 μm and about 2,000 μm. Thickness T2 may also be equal to or slightly smaller than (for example, greater than about 80 percent and smaller than 100 percent) the thickness of package component 24, and may be equal to or slightly smaller than the thicknesses of SoC die 100 and memory stack 108. Spacing 51, which is the space between the edge of core frame 26 and the corresponding nearest edge of package 60, may be in the range between about 10 μm and about 3,000 μm. The spacing S2 between core frame 26 and package component 24 may be in the range between about 10 μm and about 3,000 μm.

FIG. 10 further illustrates the bonding of package 60 onto package component 58 to form package 61. The respective process is illustrated as process 218 in the process flow 200 shown in FIG. 16. In accordance with some embodiments of the present disclosure, package component 58 comprises a printed circuit board, another package, or the like. In accordance with some embodiments of the present disclosure, a metal ring 62 is attached to the top surface of package 60 through adhesive film 63. The respective process is illustrated as process 220 in the process flow 200 shown in FIG. 16. Metal ring 62 may provide further mechanical support to reduce the warpage of package 61. In accordance with alternative embodiments, no metal ring 62 is attached. Metal ring 62 may have a similar shape as core frame 26 (FIG. 3B). The outer edges of metal ring 62 may be flushed with the outer edges of core frame 26.

FIGS. 12 through 15 illustrate cross-sectional views of intermediate stages in the formation of a package in accordance with alternative embodiments of the present disclosure. Unless specified otherwise, the materials and the formation processes of the components in these embodiments are essentially the same as the like components, which are denoted by like reference numerals in the preceding embodiments shown in FIGS. 1, 2A, 2B, 3A, 3B, and 4-10. The details regarding the formation process and the materials of the components shown in FIGS. 12 through 15 may thus be found in the discussion of the preceding embodiments. The initial steps of these embodiments are essentially the same as shown in FIGS. 1, 2A, 2B, 3A, 3B, and 4-8. It is appreciated that the processes shown in FIG. 12 through 15 illustrate the process in which reconstructed wafer 50 has been sawed apart into packages 60.

Figure 12:
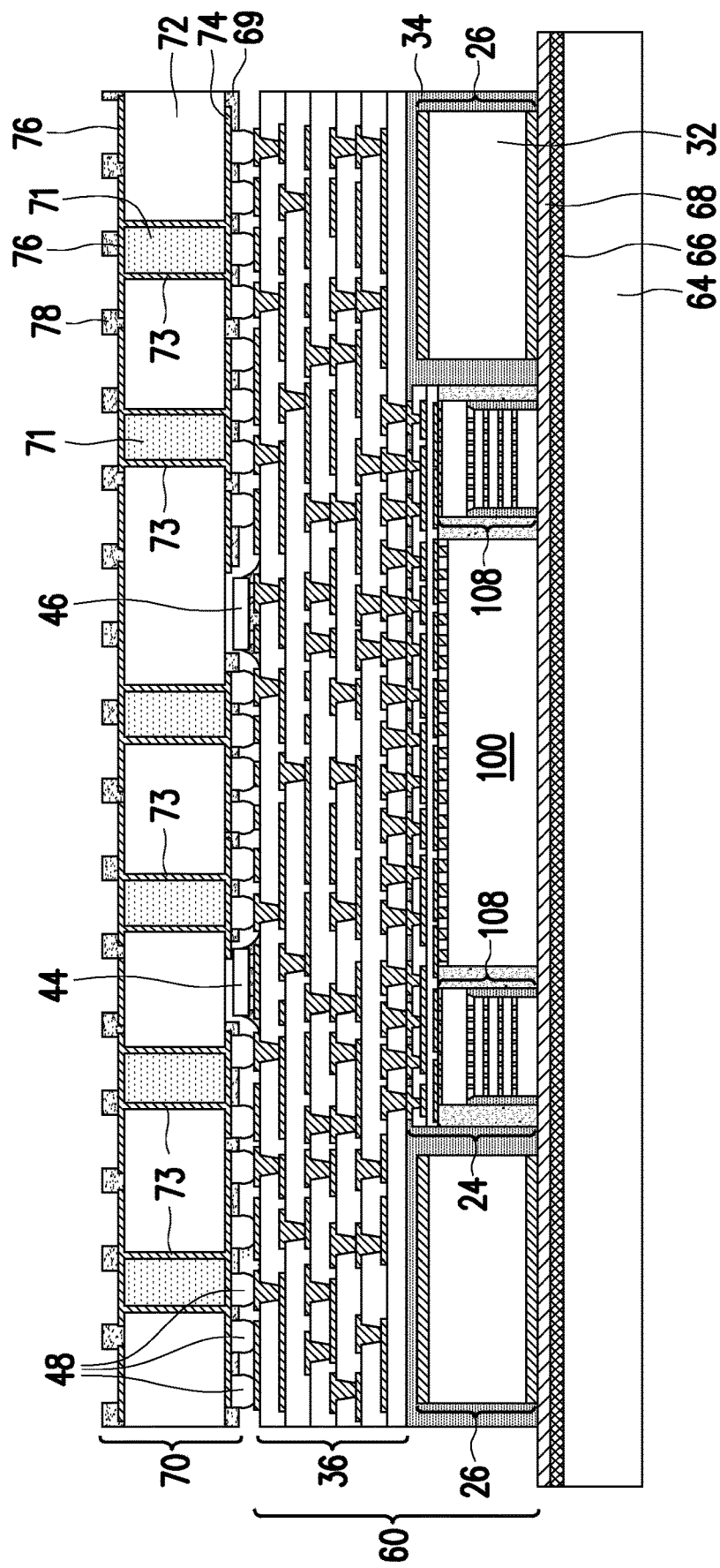
FIGS. 12 through 15 illustrate the cross-sectional views of intermediate stages in the formation of a package in accordance with some embodiments.

Referring to FIG. 12, in accordance with some embodiments of the present disclosure, packages 60 are placed on carrier 64, over which release film 66 and DAF 68 are formed. Carrier 64, release film 66, and DAF 68 may be formed of similar materials and have similar functions and similar shapes as that of carrier 20, release film 22, and DAF 23, respectively. For example, carrier 64 may have a round top-view shape as shown in FIG. 11A, or have a rectangular top-view shape as shown in FIG. 11B. A plurality of packages 60 (with one illustrated) are then placed on DAF 68, and may be placed as rows and columns. A plurality of core substrates 70 (with one illustrated) are bonded to the respective underlying packages 60 through electrical connectors 48.

In accordance with some embodiments of the present disclosure, cored package substrates 70 may include core dielectric 72, with PTHs 73 penetrating through core dielectric layer 72. Core dielectric 72 may be formed of similar materials as that of core dielectric 32 in core frame 26. PTHs 73 are metal pipes, with dielectric regions 71 filling the regions encircled by PTHs 73. RDLs 74 and 76 are formed on the opposite sides of core dielectric 72, and are interconnected through PTHs 73. Solder regions 48 penetrate through dielectric layer 69 to contact RDLs 74, and some RDLs 76 are exposed through the openings in dielectric layer 78. In accordance with some embodiments of the present disclosure, each of cored package substrates 70 has a single layer of RDLs on each side (over or under) core dielectric 72. In accordance with other embodiments, there is more than one layer of RDLs on each side of core dielectric 72. The Coefficient of Thermal Expansion (CTE) of cored package substrates 70 is close to (and may be higher than) the CTE of package component 58 (FIG. 15) that will be bonded thereon, and lower than the CTE of front-side redistribution structure 36. Accordingly, cored package substrates 70 is used as a buffer between package component 58 and front-side redistribution structure 36 to reduce and absorb stress.

Figure 13:
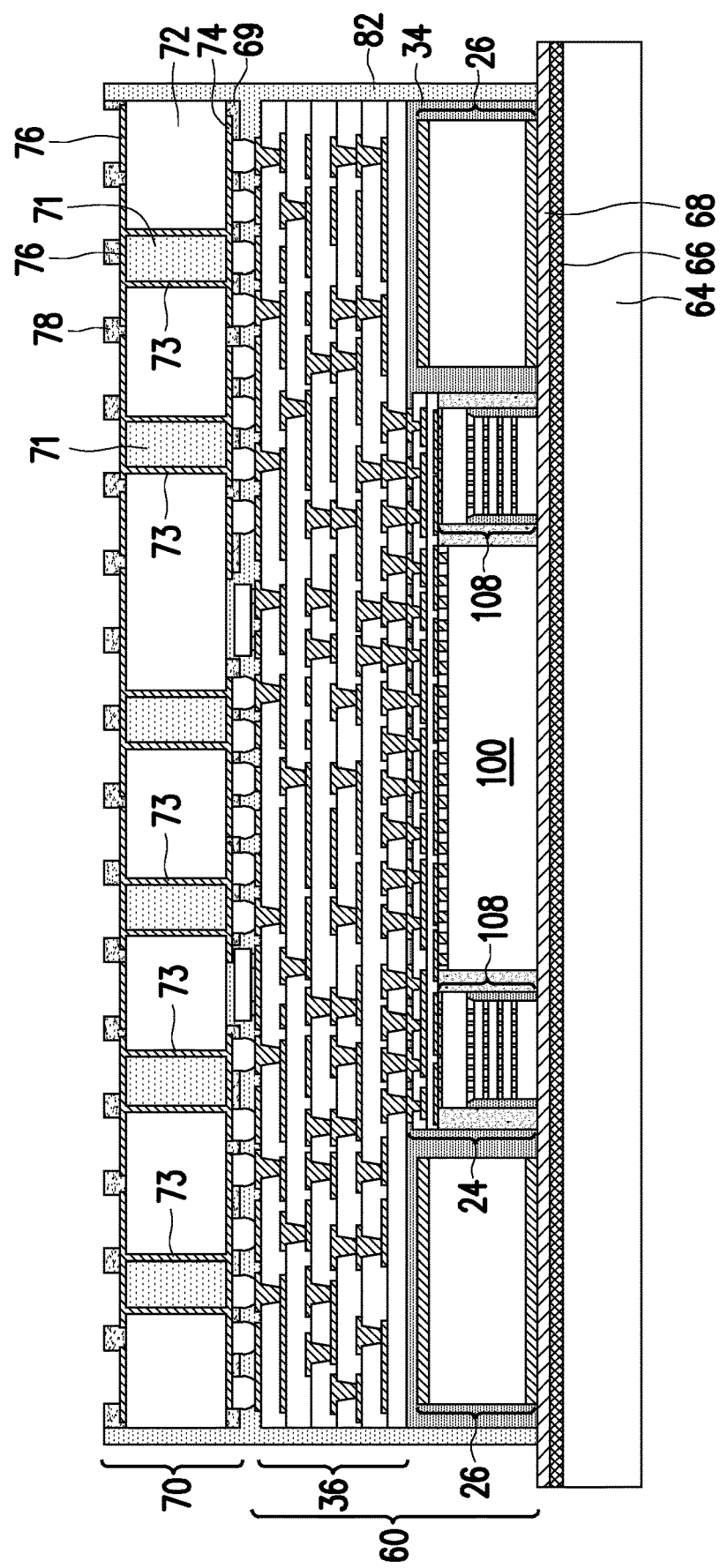

FIG. 13 illustrates the encapsulation of the above-formed structure in encapsulant 82, which may be a molding compound, a molding underfill, or the like in accordance with some embodiments. The encapsulation may be performed through expose molding, so that RDLs 76 are not covered by the encapsulant 82. Encapsulant 82 extends to the sidewalls of packages 60. Encapsulant 34 and encapsulant 82 may be formed of the same or different types of materials (including the materials of the base materials and the materials of filler particles therein). Regardless of the materials of the materials, since encapsulant 34 has been sawed and planarized, the filler particles that are sawed or planarized have partial spherical shapes, and hence the interface between encapsulant 34 and encapsulant 82 is distinguishable.

In accordance with some embodiments of the present disclosure, as shown in FIG. 13, packages 60, which have been sawed apart from reconstructed wafer 50 (FIG. 8), are used in the packaging processes shown in FIGS. 12 through 15. In accordance with other embodiments, instead of sawing reconstructed wafer 50 apart, core substrates 70 are bonded to reconstructed wafer 50, followed by the encapsulation process and the sawing process. As a result, encapsulant 82 does not extend to the same level as package 60. Rather, an entirety of encapsulant 82 is over package 60.

Figure 14:
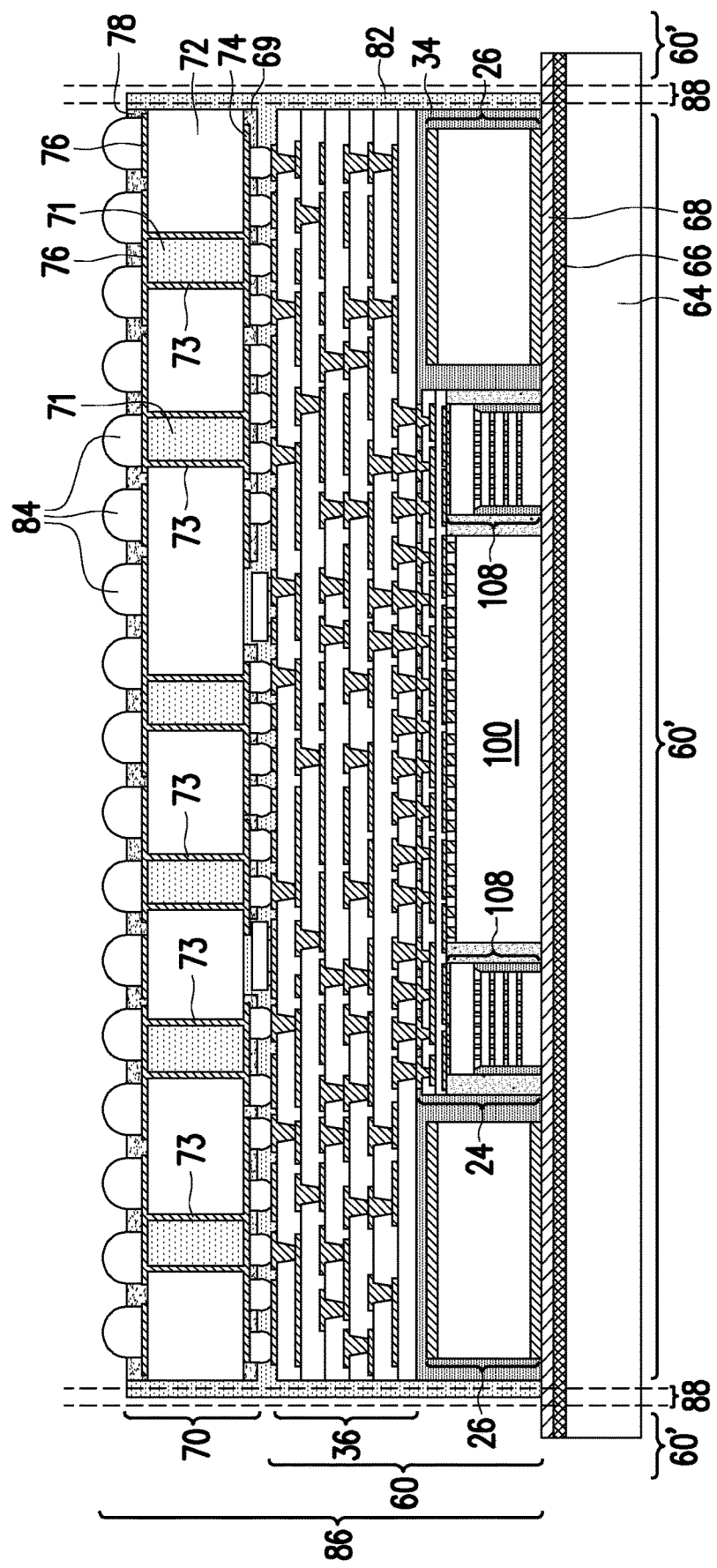

FIG. 14 illustrates the formation of electrical connectors 84, which may be solder regions, metal pillars, etc. The resulting structure over DAF 68 is referred to as reconstructed wafer 86. Next, reconstructed wafer 86 is de-bonded from carrier 64, for example, by projecting a light beam to decompose release film 66. A singulation process is then performed along scribe lines 88, so that a plurality of identical packages 60' are formed.

Figure 15:
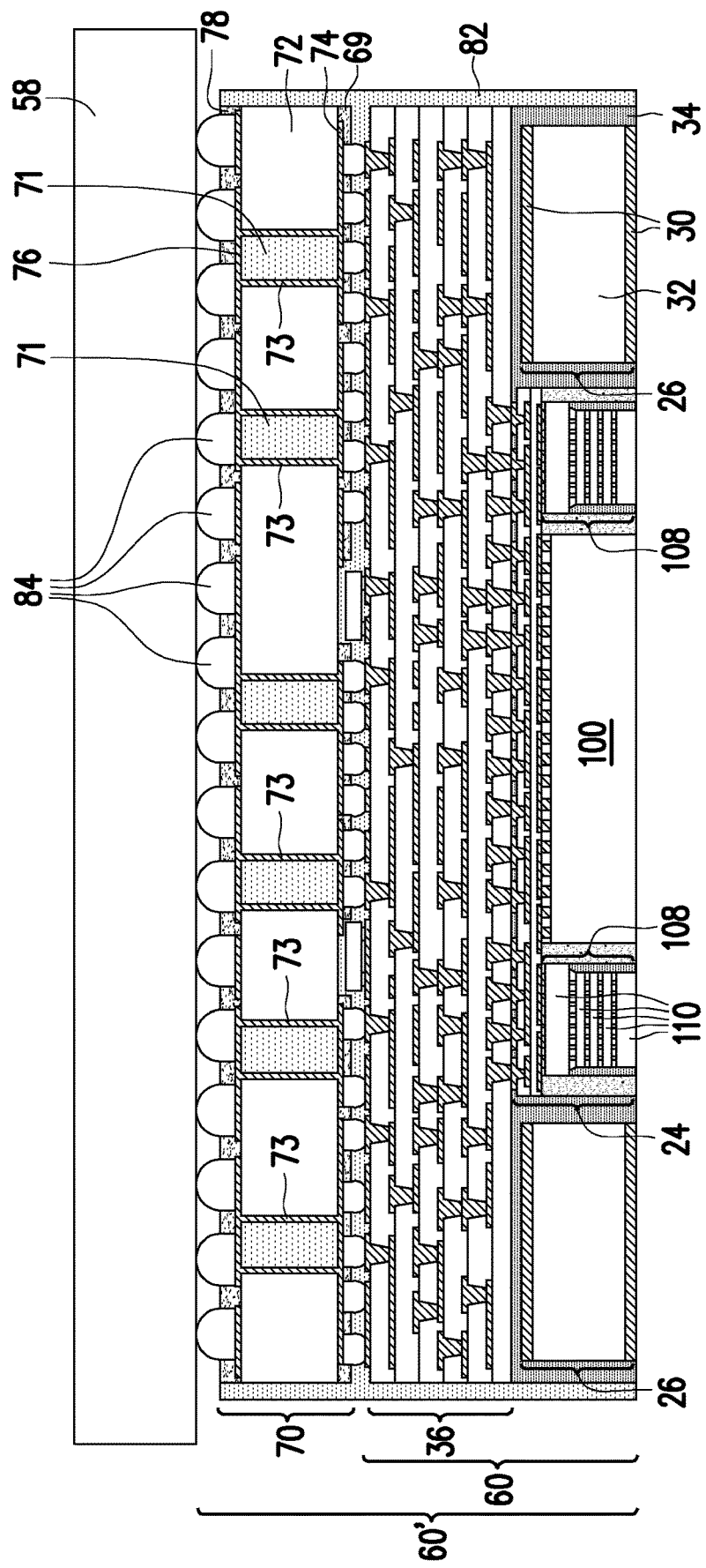

One of packages 60' is shown in FIG. 15. FIG. 15 also illustrates the bonding of package 60' to package component 58, which may be a printed circuit board, another package, or the like.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. The embodiments of the present disclosure are suitable for the formation of large packages, for example, having the sizes of 80 mm×80 mm or larger, which are often used in HPC applications. The large packages often suffer from serious warpage problems. By packaging a core frame at the same level as the HPC packages, the thickness of the core does not affect the routing length of electrical signals and power. For example, for the packages with sizes of 80 mm×80 mm, the warpage may be reduced from 2,434 µm if no core frame is used to 200 µm if the core frame is used. For the packages with sizes of 53.5 mm×53.5 mm, the warpage may be reduced from 942 µm if no core frame is used to 148 µm if the core frame is used. For the packages with sizes of 44 mm×44 mm, the warpage may be reduced from 386 µm if no core frame is used to 139 µm if the core frame is used. The performance of the resulting package is also not affected by the thickness of the core frame since the core frame is placed at the same level as the package components (such as an HPC package). Also, the resulting package may be formed of thin and short RDLs, and hence the signal integrity of the package is improved.

In accordance with some embodiments of the present disclosure, a method comprises placing a first package component over a carrier, wherein the first package component comprises a device die; placing a core frame over the carrier, wherein the core frame forms a ring encircling the first package component; encapsulating the core frame and the first package component in an encapsulant; forming redistribution lines over the core frame and the first package component; and forming electrical connectors over and electrically coupling to the first package component through the redistribution lines. In an embodiment, the method further comprises, after the encapsulating, planarizing the encapsulant until conductive features of the first package component are revealed. In an embodiment, the core frame comprises a core dielectric, and metal plates on opposite sides of the core dielectric. In an embodiment, the core frame is free from conductive pipes penetrating through the core dielectric. In an embodiment, the device die comprises a SoC die, and an additional encapsulant encapsulating the SoC die therein. In an embodiment, the method further comprises performing a die saw to form a package, with the first package component being in the package; and bonding a second package component to the package through the electrical connectors, wherein the second package component comprises: an additional core dielectric; additional conductive pipes penetrating through the additional core dielectric; and additional redistribution lines on opposite sides of the additional core dielectric and interconnected through the additional conductive pipes. In an embodiment, the method further comprises performing a die-saw process to form a package, with the first package component in the package; and attaching a metal ring to the package. In an embodiment, the method further comprises bonding a passive device to the redistribution lines, wherein the passive device is at a same level as the electrical connectors.

In accordance with some embodiments of the present disclosure, a method comprises placing a core frame over a carrier, wherein the core frame comprises: a core dielectric; and a first metal plate and a second metal plate on opposite sides of the core dielectric; placing a package component in an opening in the core frame and over the carrier, wherein the package component comprises a device die; encapsulating the core frame and the package component in an encapsulant; and forming redistribution lines over the core frame and the package component, wherein the redistribution lines are electrically connected to the package component, and are electrically decoupled from the core frame. In an embodiment, the method further comprises forming solder regions over and electrically coupling to the redistribution lines, wherein all of the solder regions are electrically decoupled from the core frame. In an embodiment, the first metal plate and the second metal plate are blanket metal plates with no hole therein. In an embodiment, the method further comprises, after the encapsulating, performing a planarizing process to reveal top conductive features of the package component, wherein the planarizing process stops before the core frame is revealed. In an embodiment, the method further comprises forming a dielectric layer over and contacting the encapsulant and the package component, with a bottom layer of the redistribution lines extending into the dielectric layer, wherein the dielectric layer is spaced apart from the core frame by a layer of the encapsulant. In an embodiment, the method further comprises performing a die-saw process to form a package comprising the package component, the core frame, and a portion of the encapsulant, wherein the die-saw process does not cut through the core frame.

In accordance with some embodiments of the present disclosure, a package comprises a package component comprising a device die therein; a core frame forming a ring encircling the package component; an encapsulant encapsulating the package component and the core frame therein; a plurality of dielectric layers over the encapsulant; and redistribution lines in the plurality of dielectric layers, wherein the redistribution lines are electrically connected to the package component, and are electrically decoupled from the core frame. In an embodiment, the core frame comprises: a core dielectric; and a first metal plate and a second metal plate on opposite sides of the core dielectric. In an embodiment, the first metal plate and the second metal plate are blanket metal plates free from holes therein. In an embodiment, the core frame is free from conductive features penetrating through the core dielectric. In an embodiment, the core dielectric comprises fiber glass. In an embodiment, the package further comprises a package substrate bonded to the package component, wherein the package substrate comprises an additional core dielectric; additional conductive pipes penetrating through the additional core dielectric; and additional redistribution lines on opposite sides of the additional core dielectric and interconnected through the additional conductive pipes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package comprising:
a package component comprising a device die therein;
a core frame forming a ring encircling the package component, wherein the core frame comprises:
a core dielectric; and
a first metal plate and a second metal plate on a top side and a bottom side of the core dielectric, wherein the first metal plate and the second metal plate are electrically decoupled from each other, and wherein one of the first metal plate and the second metal plate comprises an edge vertically aligned with one of opposing edges of the core dielectric;
an encapsulant encapsulating the package component and the core frame therein;
a plurality of dielectric layers over the encapsulant, wherein the core frame is spaced apart from the plurality of dielectric layers; and
redistribution lines in the plurality of dielectric layers, wherein the redistribution lines are electrically connected to the package component, and are electrically decoupled from the core frame.

2. The package of claim 1, wherein the first metal plate is overlying and physically contacting the core dielectric, and the second metal plate is underlying and physically contacting the core dielectric.

3. The package of claim 1, wherein the core frame is free from conductive features penetrating through the core dielectric.

4. The package of claim 1, wherein the core dielectric comprises fiber glass.

5. The package of claim 1 further comprising a package substrate bonded to the package component, wherein the package substrate comprises:
an additional core dielectric;
conductive pipes penetrating through the additional core dielectric; and
additional redistribution lines on opposite sides of the additional core dielectric and interconnected through the conductive pipes.

6. The package of claim 1, wherein a portion of the encapsulant is directly over the core frame, and the portion of the encapsulant separates a bottom dielectric layer in the plurality of dielectric layers from the core frame.

7. The package of claim 1, wherein the package component has a bottom surface level with a bottom surface of the core frame.

8. The package of claim 1, wherein both of the first metal plate and the second metal plate comprise edges vertically aligned to the opposing edges of the core dielectric.

9. The package of claim 1, wherein an another one of the first metal plate and the second metal plate also comprises an additional edge vertically aligned with an additional one of the opposing edges of the core dielectric.

10. A package comprising:
a package component comprising a device die therein;
a core frame forming a ring encircling the package component, wherein the core frame comprises:
a dielectric core;
a first metal plate over and contacting the dielectric core; and
a second metal plate under and contacting the dielectric core, wherein the first metal plate and the second metal plate are electrically disconnected from each other, and wherein one of the first metal plate and the second metal plate comprises a first edge vertically aligned to a second edge of the dielectric core;
an encapsulant encapsulating the package component and the core frame therein, wherein the encapsulant extends to a bottom surface of the second metal plate;
a plurality of dielectric layers over the encapsulant; and
redistribution lines in the plurality of dielectric layers, wherein the redistribution lines are electrically connected to the package component.

11. The package of claim 10, wherein the encapsulant contacts opposite sidewalls of the dielectric core.

12. The package of claim 10, wherein each of the first metal plate and the second metal plate are fully enclosed in dielectric materials.

13. The package of claim 10, wherein the encapsulant comprises a portion overlapping and contacting the first metal plate.

14. The package of claim 13, wherein the portion of the encapsulant separates the plurality of dielectric layers from the first metal plate.

15. The package of claim 10, wherein the package component comprises a plurality of device dies, and wherein the redistribution lines are electrically interconnected to the plurality of device dies.

16. The package of claim 10 further comprising:
an adhesive contacting the second metal plate; and
a metal ring contacting the adhesive.

17. A package comprising:
a package component comprising a device die therein;
a core frame forming a ring encircling the package component, wherein the core frame comprises:
a dielectric core, wherein the dielectric core comprises a first portion and a second portion on opposing sides of the package component;
a first metal plate over and contacting the dielectric core; and
a second metal plate under and contacting the dielectric core, wherein the first metal plate and the second metal plate are electrically disconnected from each other, and wherein in a cross-sectional view of the core frame, both of the first metal plate and the second metal plate comprise a first edge and a second edge vertically aligned to a third edge and a fourth edge of the dielectric core;
an encapsulant encapsulating the package component and the core frame therein, wherein the encapsulant physically contacts opposing edges of the first portion of the dielectric core to form a first vertical interface and a second vertical interface;
a plurality of dielectric layers over the encapsulant; and
redistribution lines in the plurality of dielectric layers, wherein the redistribution lines are electrically connected to the package component.

18. The package of claim 17, wherein each of the first metal plate and the second metal plate are fully enclosed in dielectric materials.

19. The package of claim 17, wherein a first top surface of the core frame is lower than a second top surface of the package component, and wherein a first bottom surface of the core frame is coplanar with a second bottom surface of the package component.

20. The package of claim 17 further comprising:
an adhesive contacting the second metal plate; and
a metal ring contacting the adhesive.

* * * * *